United States Patent
Yen et al.

(10) Patent No.: US 10,038,033 B2
(45) Date of Patent: Jul. 31, 2018

(54) IMAGE SENSOR

(71) Applicant: INDUSTRIAL TECHNOLOGY RESEARCH INSTITUTE, Hsinchu (TW)

(72) Inventors: Pei-Wen Yen, New Taipei (TW); Yan-Rung Lin, Hsinchu (TW); Kai-Ping Chuang, Zhubei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 14/983,445

(22) Filed: Dec. 29, 2015

(65) Prior Publication Data

US 2017/0186818 A1    Jun. 29, 2017

(51) Int. Cl.
 *H01L 27/30* (2006.01)
 *H01L 51/00* (2006.01)
 *H01L 51/44* (2006.01)

(52) U.S. Cl.
CPC .......... *H01L 27/307* (2013.01); *H01L 51/005* (2013.01); *H01L 51/0034* (2013.01); *H01L 51/0036* (2013.01); *H01L 51/441* (2013.01); *H01L 2251/301* (2013.01); *H01L 2251/303* (2013.01)

(58) Field of Classification Search
None
See application file for complete search history.

(56) References Cited

U.S. PATENT DOCUMENTS

| | | |
|---|---|---|
| 5,451,769 A | 9/1995 | McAdoo et al. |
| 8,102,693 B2 | 1/2012 | Sargent et al. |
| 8,779,413 B1 | 7/2014 | Landry |

(Continued)

FOREIGN PATENT DOCUMENTS

| | | |
|---|---|---|
| TW | 200843093 A | 11/2008 |
| TW | 201212215 A | 3/2012 |

(Continued)

OTHER PUBLICATIONS

Yunlong Guo et al., "Air-Stable and Solution-Processable Perovskite Photodetectors for Solar-Blind UV and Visible Light", The Journal of Physical Chemistry Letters, pp. 535-539, Jan. 22, 2015.

(Continued)

*Primary Examiner* — Jay C Chang
(74) *Attorney, Agent, or Firm* — Rabin & Berdo, P.C.

(57) ABSTRACT

An image sensor is provided. The image sensor includes a pixel sensing circuit corresponding to at least a first pixel region and a second pixel region adjacent to each other, a pixel electrode disposed on the pixel sensing circuit, and a opto electrical conversion layer including a photo sensing layer and a carrier transport layer disposed on the pixel sensing circuit and the pixel electrode. The pixel electrode is electrically connected to the pixel sensing circuit and includes a plurality of first electrodes and a plurality of second electrodes. The first electrodes and the second electrodes are coplanar and have different polarities. The first electrode or the second electrode located in the first pixel region is adjacent to the first electrode or the second electrode having the same polarity located in the second pixel region.

9 Claims, 10 Drawing Sheets

(56) References Cited

U.S. PATENT DOCUMENTS

| 8,822,897 B2 | 9/2014 | Tian et al. |
| 2007/0075253 A1* | 4/2007 | Misawa ............... G01T 1/1644 |
| | | 250/370.11 |
| 2009/0127599 A1 | 5/2009 | Kim et al. |
| 2009/0322923 A1* | 12/2009 | Maehara ............... H01L 27/307 |
| | | 348/308 |
| 2010/0060769 A1* | 3/2010 | Inuiya ............... H01L 27/14623 |
| | | 348/311 |
| 2011/0025899 A1 | 2/2011 | Schmaelzle et al. |
| 2015/0187844 A1* | 7/2015 | Lee ....................... H04N 5/378 |
| | | 250/208.1 |

FOREIGN PATENT DOCUMENTS

| TW | 2014-05790 A | 2/2014 |
| TW | 201405791 A | 2/2014 |
| TW | 201508937 A | 3/2015 |
| TW | 201515201 A | 4/2015 |
| TW | 201532255 A | 8/2015 |

OTHER PUBLICATIONS

Taiwanese Office Action dated Nov. 8, 2016.
Taiwanese Office Action dated Jan. 26, 2018.

* cited by examiner

IMAGE SENSOR

TECHNICAL FIELD

The present disclosure relates to an image sensor.

BACKGROUND

In years, researchers in related fields have been emphasizing on developing highly photo-sensitive sensing components, in order to provide CMOS image sensors having bright performance under dark light environments.

However, photo sensing components are usually made of silicon materials, and the pixel numbers have been greatly increased in order to increase resolution while maintaining the same chip area, thereby continuously decreasing the pixel sizes and decreasing the amount of lights as well as the light collection area. Due to the restriction of the amount of lights and the light collection area of sensing components, even with the continuous progress of semiconductor manufacturing processes, the pixel areas of sensing components still cannot be further reduced, the pixel numbers still cannot be further increased, and thus the resolution of image sensing chips cannot be further increased as well. Therefore, how to increase the amount of lights and the light conversion efficiency have been the current research and development focus of current image sensing components.

SUMMARY

One exemplary embodiment of the present disclosure relates to an image sensor. The image sensor includes a pixel sensing circuit, a pixel electrode, and an opto electrical conversion layer. The pixel sensing circuit is corresponding to a first pixel region and a second pixel region adjacent to each other. The pixel electrode is disposed on the pixel sensing circuit. The pixel electrode is electrically connected to the pixel sensing circuit and includes a plurality of first electrodes and a plurality of second electrodes. The first electrodes and the second electrodes are coplanar and have different polarities. The first electrode or the second electrode located in the first pixel region is adjacent to the first electrode or the second electrode having the same polarity located in the second pixel region. The opto electrical conversion layer is disposed on the pixel sensing circuit and the pixel electrode. The opto electrical conversion layer includes a carrier transport layer and a photo sensing layer disposed on the carrier transport layer.

Another exemplary embodiment of the present disclosure relates to an image sensor. The image sensor includes a pixel sensing circuit, a pixel isolation structure, and an opto electrical conversion layer. The pixel isolation structure is disposed on the pixel sensing circuit. The pixel isolation structure is electrically connected to the pixel sensing circuit and includes a first electrode and a second electrode, and the first electrode and the second electrode are coplanar. The opto electrical conversion layer is disposed on the pixel sensing circuit, and the opto electrical conversion layer is disposed between the first electrode and the second electrode. A top surface of the opto electrical conversion layer is below a top surface of the pixel isolation structure.

The following description is made with reference to the accompanying drawings and embodiments.

BRIEF DESCRIPTION OF THE DRAWINGS

FIG. 2-1 is a schematic view of an image sensor according to another embodiment of the present disclosure;

FIG. 2-2 is a schematic view of an image sensor according to another embodiment of the present disclosure;

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

In the embodiments of the present disclosure, in the image sensor, a top surface of the opto electrical conversion layer is below a top surface of the pixel isolation structure, such that the opto electrical conversion layer could be made by a coating process, and the as-formed opto electrical conversion layer could be isolated within a pixel region by the pixel isolation structure due to the height difference of the two top surfaces; accordingly, issues of occurrence of crosstalk caused by the opto electrical conversion layer in adjacent pixel regions could be prevented. Details of embodiments of the present disclosure are described hereinafter with accompanying drawings. Specific structures and compositions disclosed in the embodiments are for examples and for explaining the disclosure only and are not to be construed as limitations. A person having ordinary skill in the art may modify or change corresponding structures and compositions of the embodiments according to actual applications.

Figure 1A:
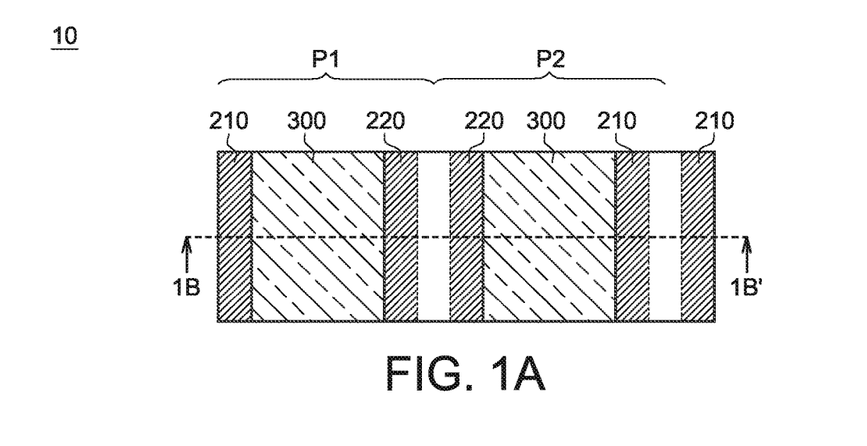
FIG. 1A is a top view of an image sensor according to an embodiment of the present disclosure.
Figure 1B:
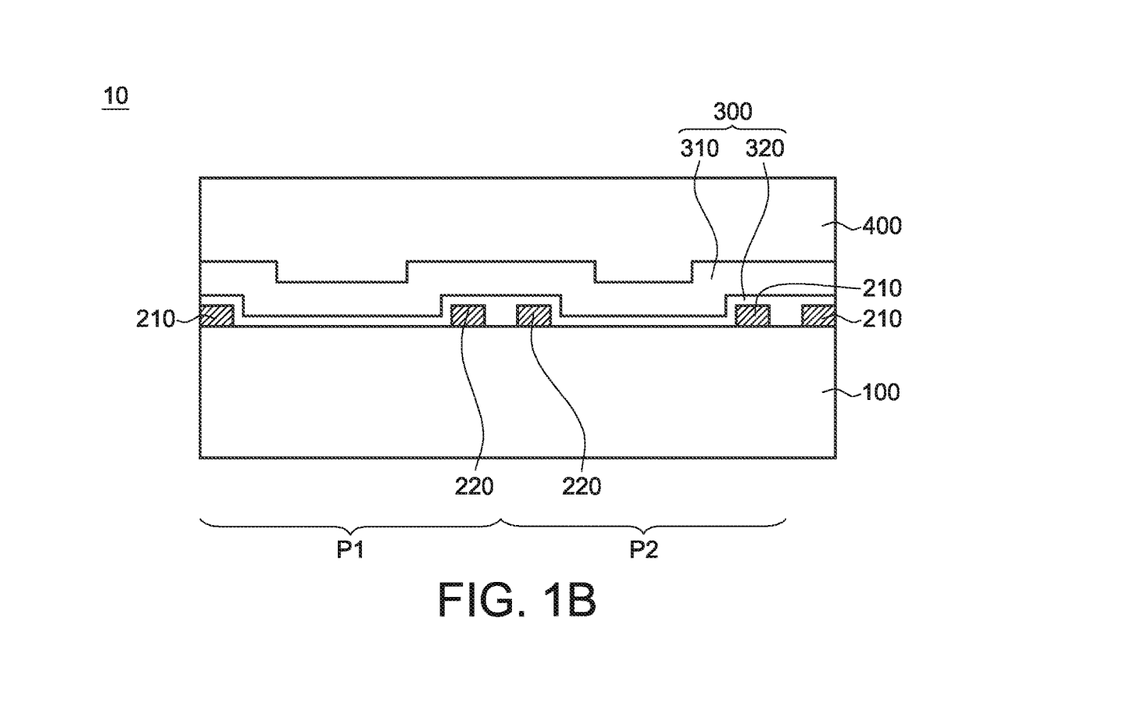
FIG. 1B is a cross-sectional view along the cross-section line 1B-16' in FIG. 1A.

FIG. 1A is a top view of an image sensor according to an embodiment of the present disclosure, and FIG. 1B is a cross-sectional view along the cross-section line 1B-1B' in FIG. 1A. As shown in FIGS. 1A-1B, the image sensor 10 includes a pixel sensing circuit 100, a pixel electrode (e.g. 210, 220), and an opto electrical conversion layer 300. The pixel sensing circuit 100 is corresponding to at least a first pixel region P1 and a second pixel region P2 adjacent to each other. The pixel electrode is disposed on the pixel sensing circuit 100. The pixel electrode includes a plurality of first electrodes 210 and a plurality of second electrode 220, and the pixel electrode is electrically connected to the pixel sensing circuit 100. The first electrodes 210 and the second electrodes 220 are coplanar and have different polarities. The first electrode 210 or the second electrode 220 located in the first pixel region P1 is adjacent to the first electrode 210 or the second electrode 220 having the same polarity located in the second pixel region P2. The opto electrical conversion layer 300 is disposed on the pixel sensing circuit 100 and the pixel electrode. The opto electrical conversion layer 300 includes a photo sensing layer 310 and a carrier transport layer 320, and the photo sensing layer 310 is disposed on the carrier transport layer 320.

In the embodiment, the carrier transport layer 320 may be an electron transport layer (ETL) or a hole transport layer (HTL), providing with functions of enhancing separations of excitons and transporting carriers, and thus the overall opto electrical conversion efficiency of the opto electrical conversion layer 300 could be increased. In addition, the carrier transport layer 320 also has functions of a carrier barrier layer. In other words, back-flows of carriers from the electrodes toward the opto electrical conversion layer 300 could be stopped, and thus the dark current could be effectively inhibited, and the stability of electrodes could be improved.

In the embodiment, the material of the carrier transport layer 320 includes titanium oxide ($TiO_2$), zinc oxide (ZnO), aluminum oxide ($Al_2O_3$), [6,6]-phenyl-C61-butyric acid methyl ester (PCBM), PEDOC:PSS, nickel oxide (NiO) and/or vanadium oxide ($V_2O_5$), PFN, ethoxy) polyethylene imine (PEIE), PEI, molybdenum oxide ($MoO_3$), tungsten oxide ($WO_3$), lithium fluoride (LiF), bathophenanthroline (bphen), or Alq3, but not limited thereto.

In the embodiment, the material of the first electrodes 210 is such as different from the material of the second electrodes 220. By matching the different work functions of different electrode materials to the energy levels of the opto electrical conversion layer 300, the conversion efficiency of the opto electrical conversion layer 300 could be increased, and the dark currents could be inhibited. In some embodiments, the material of the first electrodes 210 and the material of the second electrodes 220 may respectively include aluminum (Al), gold (Au), silver (Ag), titanium (Ti), nickel (Ni), copper (Cu), tantalum (Ta), tungsten (W), titanium nitride (TiN), and/or Al clapped with TiN, or another metal which is compatible with a semiconductor manufacturing process.

A modification layer may be located on the photo sensing layer for reducing defects on the surface of the photo sensing layer or interstitial defects. The material of the modification layer may be PCBM or other dangling bond-reducing material.

Figure 21:
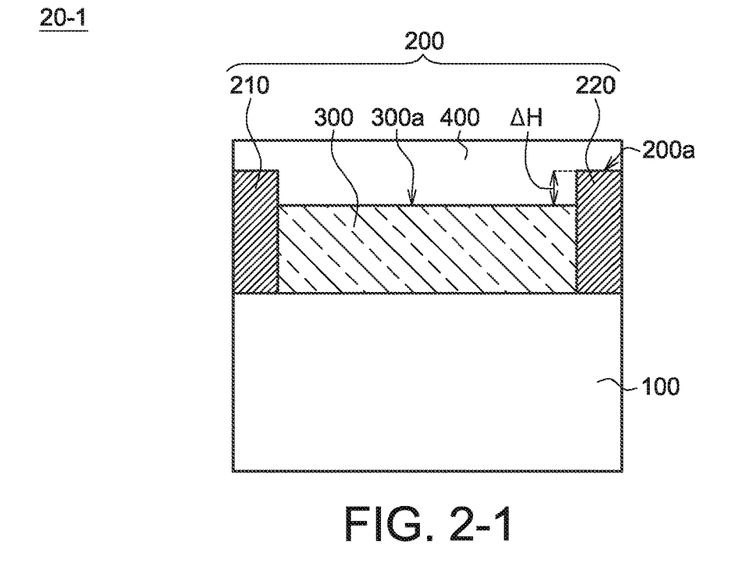

FIG. 2-1 is a schematic view of an image sensor according to another embodiment of the present disclosure. As shown in FIG. 2-1, the image sensor 20-1 includes a pixel sensing circuit 100, a pixel isolation structure 200, and an opto electrical conversion layer 300. The pixel isolation structure 200 is disposed on the pixel sensing circuit 100. In the embodiment, the pixel isolation structure 200 is electrically connected to the pixel sensing circuit 100 and includes a first electrode 210 and a second electrode 220. The opto electrical conversion layer 300 is disposed on the pixel sensing circuit 100, and a top surface 300a of the opto electrical conversion layer 300 is below a top surface 200a of the pixel isolation structure 200.

In the embodiment, as shown in FIG. 2-1, a height difference 4H between the top surface 300a of the opto electrical conversion layer 300 and the top surface 200a of the pixel isolation structure 200 is such as larger than or equal to 0.1 μm, which may be adjusted according to various manufacturing processes. In some embodiments, the height of the opto electrical conversion layer 300 is such as 0.2-0.5 μm, and the height of the pixel isolation structure 200 is such as 0.3-3 μm.

In the embodiment, the top surface 300a of the opto electrical conversion layer 300 is below the top surface 200a of the pixel isolation structure 200, such that the as-formed opto electrical conversion layer 300 could be naturally isolated within a pixel region by the pixel isolation structure 200 due to the height difference ΔH; accordingly, issues of occurrence of crosstalk caused by the opto electrical conversion layer 300 in adjacent pixel regions could be prevented.

As shown in FIG. 2-1, the first electrode 210 and the second electrode 220 are both disposed on the pixel sensing circuit 100 and are coplanar. In comparison to the conventional design of stacking two electrodes vertically, the single-layered electrode design of the first electrode 210 and the second electrode 220 may further increase the amount of receiving lights.

In the embodiment, the material of the first electrode 210 and the material of the second electrode 220 may be the same or different. In the embodiment, the material of the first electrode 210 and the material of the second electrode 200 may respectively include aluminum (Al), gold (Au), silver (Ag), titanium (Ti), nickel (Ni), copper (Cu), tantalum (Ta), tungsten (W), titanium nitride (TiN), and/or Al clapped with TiN, or other metal which is compatible with a semiconductor manufacturing process, but not limited thereto.

As shown in FIG. 2-1, in the embodiment, the opto electrical conversion layer 300 is located between the first electrode 210 and the second electrode 220.

In some embodiments, the opto electrical conversion layer 300 may include an organic material of an inorganic-organic composite material, for example, a quantum dot material, a methyl ammonium lead iodide perovskite material, or a methyl ammonium lead iodide chloride perovskite material. For example, the quantum dot material may be a quantum dot film, the methyl ammonium lead iodide perovskite material may be methyl ammonium lead tri-iodide perovskite ($CH_3NH_3PbI_3$) nanowires, and the methyl ammonium lead iodide chloride perovskite material may be methyl ammonium lead di-iodide chloride perovskite ($CH_3NH_3PbI_2Cl$) or methyl ammonium lead iodide chloride perovskite ($CH_3NH_3PbI_{3-x}Cl_x$).

As shown in FIG. 2-1, in the embodiment, the image sensor 20-1 may further include a water-oxygen protection layer 400 (or a water protection layer). The water-oxygen protection layer 400 (or the water protection layer) covers the pixel sensing circuit 100, the pixel isolation structure 200, and the opto electrical conversion layer 300.

Figure 22:
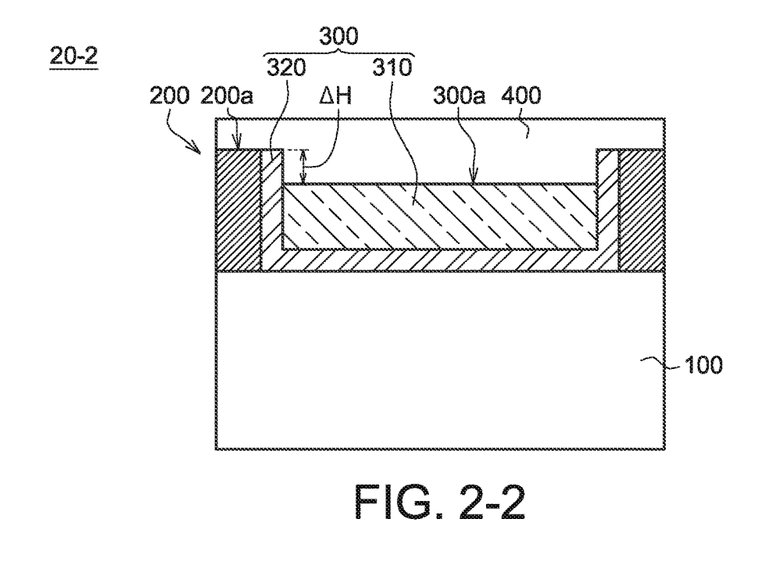

FIG. 2-2 is a schematic view of an image sensor according to another embodiment of the present disclosure. The elements in the present embodiment sharing the same or similar labels with those in the previous embodiments are the same or similar elements, and the description of which is omitted. The present embodiment is different from the embodiment as shown in FIG. 2-1 mainly in the design of the opto electrical conversion layer 300.

Please refer to FIG. 2-2. In the image sensor 20-2, the opto electrical conversion layer 300 may include a photo sensing layer 310 and a carrier transport layer 320. The carrier transport layer 320 is disposed between the pixel isolation structure 200 and the photo sensing layer 310. In the embodiment, the carrier transport layer 320 may be such as an electron transport layer (ETL) or a hole transport layer (HTL), providing with functions of enhancing separations of excitons and transporting carriers, and thus the overall opto electrical conversion efficiency of the opto electrical conversion layer 300 could be increased. In addition, the carrier transport layer 320 also has functions of a carrier barrier layer, such that back-flows of carriers from the electrodes toward the opto electrical conversion layer 300 could be stopped, and thus the dark current could be effectively inhibited, and the stability of electrodes could be improved.

In the present embodiment, as shown in FIG. 2-2, the top surface of the carrier transport layer 320 is coplanar with the top surface 200a of the pixel isolation structure 200; however, the present disclosure is not limited thereto. In some embodiments, the top surface of the carrier transport layer 320 may be below the top surface 200a of the pixel isolation structure 200.

In the embodiment, the material of the carrier transport layer 320 may include such as titanium oxide ($TiO_2$), zinc oxide (ZnO), aluminum oxide ($Al_2O_3$), [6,6]-phenyl-C61-butyric acid methyl ester (PCBM), PEDOC:PSS, nickel oxide (NiO) and/or vanadium oxide ($V_2O_5$), PFN, ethoxy polyethylene imine (PEIE), PEI, molybdenum oxide ($MoO_3$), tungsten oxide ($WO_3$), lithium fluoride (LiF), bathophenanthroline (bphen), or Alq3.

Figure 3A:
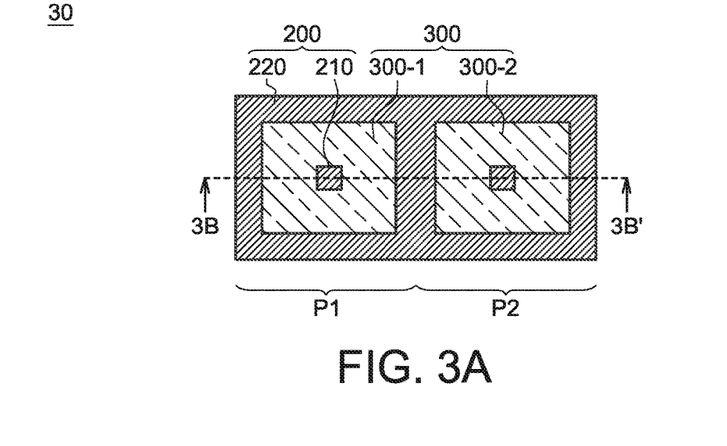
FIG. 3A is a top view of an image sensor according to an additional embodiment of the present disclosure.
Figure 3B:
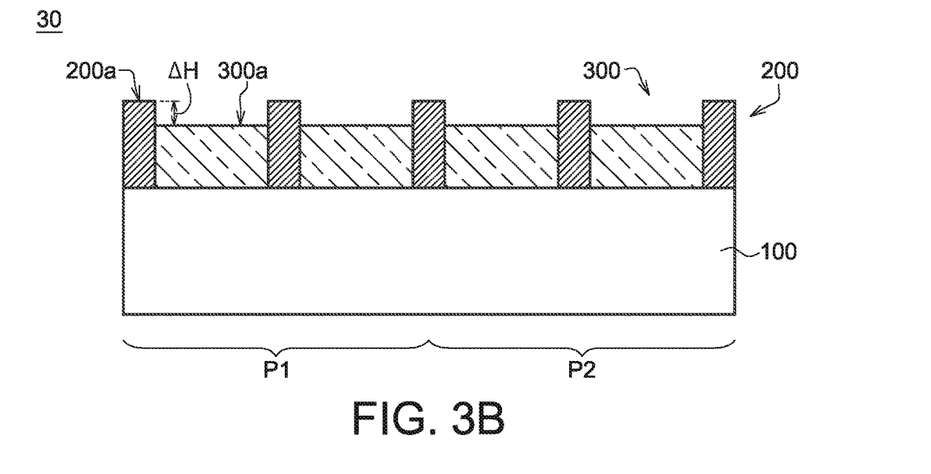
FIG. 3B is a cross-sectional view along the cross-section line 3B-3B' in FIG. 3A.

FIG. 3A is a top view of an image sensor according to an additional embodiment of the present disclosure, and FIG. 3B is a cross-sectional view along the cross-section line 3B-3B' in FIG. 3A. The elements in the present embodiment sharing the same or similar labels with those in the previous embodiments are the same or similar elements, and the description of which is omitted. The present embodiment is different from the embodiment as shown in FIG. 2-1 mainly in the design that the pixel isolation structure 200 defines multiple pixel regions.

As shown in FIGS. 3A-3B, in the image sensor 30, the pixel isolation structure 200 defines a plurality of pixel regions, for example, the pixel region P1 and the pixel region P2 as shown in FIGS. 3A-3B. The opto electrical conversion layer 300 has a plurality of opto electrical conversion portions separated from one another, for example, the opto electrical conversion portions 300-1 and 300-2 as shown in FIGS. 3A-3B. Each of the opto electrical conversion portions is disposed corresponding to each of the pixel regions; for example, the opto electrical conversion portion 300-1 is disposed corresponding to the pixel region P1, the opto electrical conversion portion 300-2 is disposed corresponding to the pixel region P2, and the opto electrical conversion portion 300-1 is separated from the opto electrical conversion portion 300-2.

As shown in FIGS. 3A-3B, the pixel isolation structure 200 of the image sensor 30 includes a first electrode 210 and a second electrode 220, the first electrode 210 is located in the middle of an opto electrical conversion portion, and the second electrode 220 surrounds each of the opto electrical conversion portions and defines each of the pixel regions. In the embodiment as shown in FIG. 3A, the second electrode 220 fully surrounds one opto electrical conversion portion. In some other embodiments, the second electrode 220 may have small openings (not shown in drawings). When the opto electrical conversion layer is made by a wet manufacturing process, the small openings allow the material of the opto electrical conversion layer to flow to the second electrode located at other pixel region(s); accordingly, the opto electrical conversion layer could be formed with equal heights in multiple pixel regions.

Figure 4A:
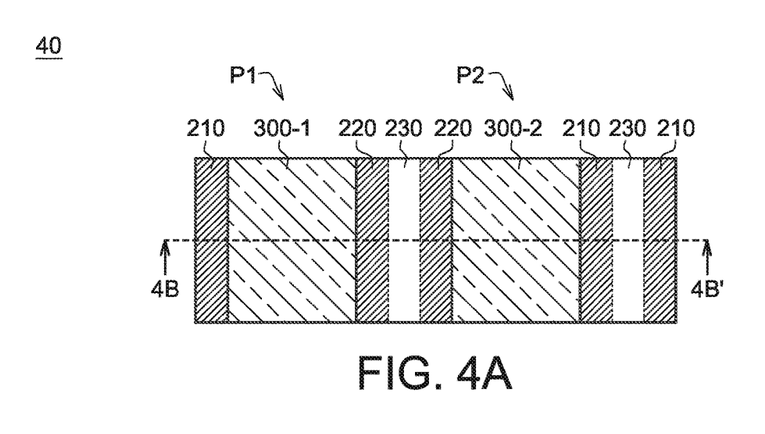
FIG. 4A is a top view of an image sensor according to a further embodiment of the present disclosure.
Figure 4B:
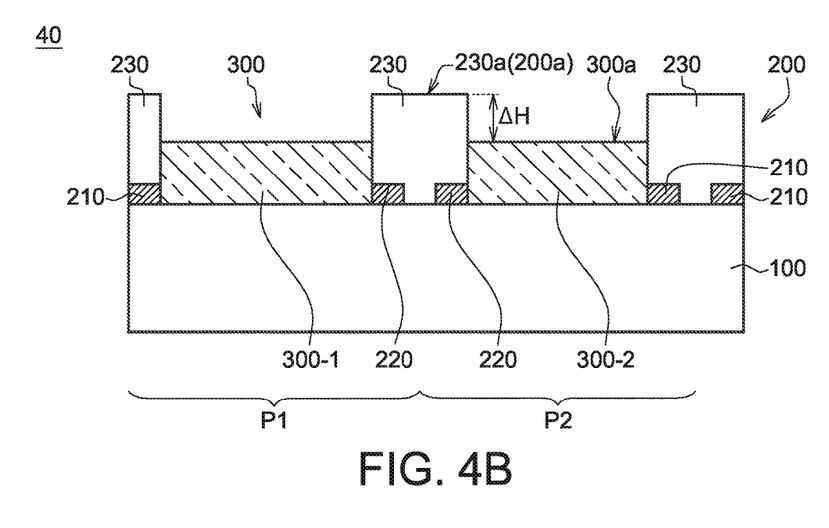
FIG. 4B is a cross-sectional view along the cross-section line 4B-4B' in FIG. 4A.

FIG. 4A is a top view of an image sensor according to a further embodiment of the present disclosure, and FIG. 4B is a cross-sectional view along the cross-section line 4B-4B' in FIG. 4A. The elements in the present embodiment sharing the same or similar labels with those in the previous embodiments are the same or similar elements, and the description of which is omitted. The present embodiment is different from the embodiment as shown in FIGS. 3A-3B mainly in the design of the pixel isolation structure 200.

As shown in FIGS. 4A-4B, in the image sensor 40, the pixel isolation structure 200 may further include a plurality of non-conductive layers 230. The non-conductive layers 230 are located on the first electrode 210 and the second electrode 220, such as, the first electrode 210, the second electrode 220, and the non-conductive layers 230 form the pixel isolation structure 200.

As shown in FIGS. 4A-4B, the top surface 200a of the pixel isolation structure 200 is the top surfaces 230a of the non-conductive layers 230. Therefore, the height difference ΔH between the top surface 200a of the pixel isolation structure 200 and the top surface 300a of the opto electrical conversion layer 300 is the height difference between the top surfaces 230a of the non-conductive layers 230 and the top surface 300a of the opto electrical conversion layer 300. In the embodiment as shown in FIGS. 4A-4B, the top surface 300a of the opto electrical conversion layer 300 is further above the top surfaces of the first electrode 210 and the second electrode 220. In the embodiment, the material of the non-conductive layers 230 is such as silicon nitride or silicon oxide.

Figure 5:
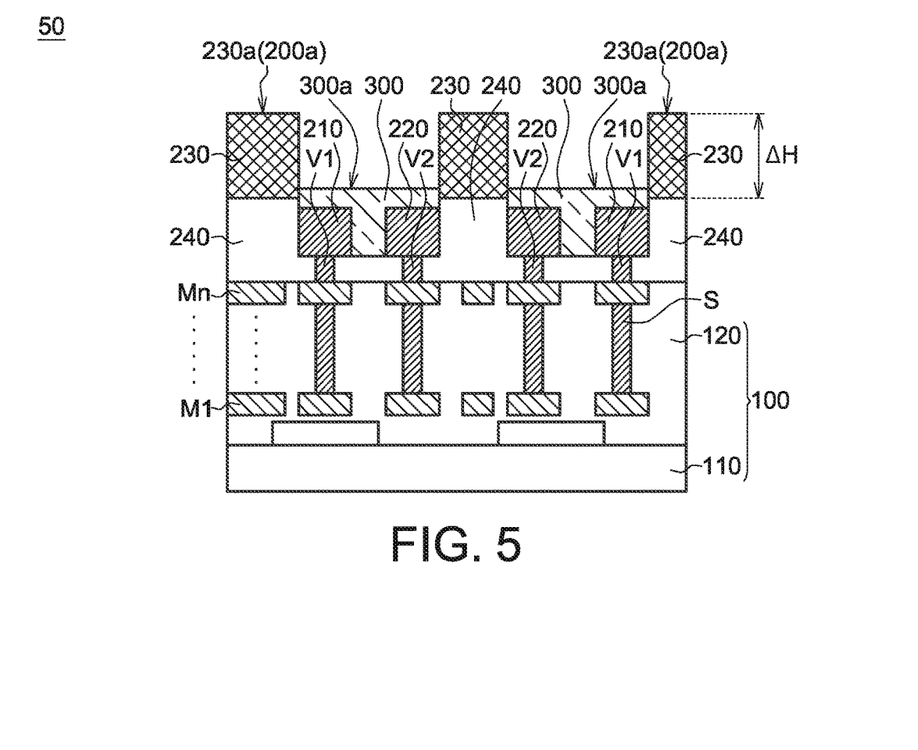
FIG. 5 is a schematic view of an image sensor according to a still further embodiment of the present disclosure.

FIG. 5 is a schematic view of an image sensor according to a still further embodiment of the present disclosure. The elements in the present embodiment sharing the same or similar labels with those in the previous embodiments are the same or similar elements, and the description of which is omitted.

As shown in FIG. 5, in the image sensor 50, the top surface 300a of the opto electrical conversion layer 300 is located above the top surfaces of the first electrode 210 and the second electrode 220. In other words, the opto electrical conversion layer 300 of the image sensor 50 covers the top surfaces of the first electrode 210 and the second electrode 220 and located between two non-conductive layers 230.

In the embodiment, the pixel sensing circuit 100 may further include a silicon substrate 110 and a pixel reading circuit 120. The pixel reading circuit 120 is located on the silicon substrate 110. In the embodiment, the pixel reading circuit 120 is such as a CMOS pixel reading circuit having metal layers M1-Mn and signal paths S. In the embodiment, the pixel isolation structure 200 is electrically connected to the pixel sensing circuit 100 through such as a connection via. For example, the first electrode 210 and the second electrode 220 are electrically connected to the metal layer Mn of the pixel sensing circuit 100 through the connection via V1 and V2 respectively. In the embodiment, the pixel isolation structure 200 may further include a non-conductive layer 240. The non-conductive layers 230 are located on the non-conductive layer 240. The non-conductive layer 240 is made by such as a dielectric material, e.g. silicon oxide layer, and the non-conductive layers 230 are used as a protection layer and are such as silicon nitride layers.

In the embodiments as previously shown in FIGS. 3A-5, the upmost metal layer in the semiconductor manufacturing process is used as the first electrode 210 and the second electrode 220 (pixel electrode).

Figure 6:
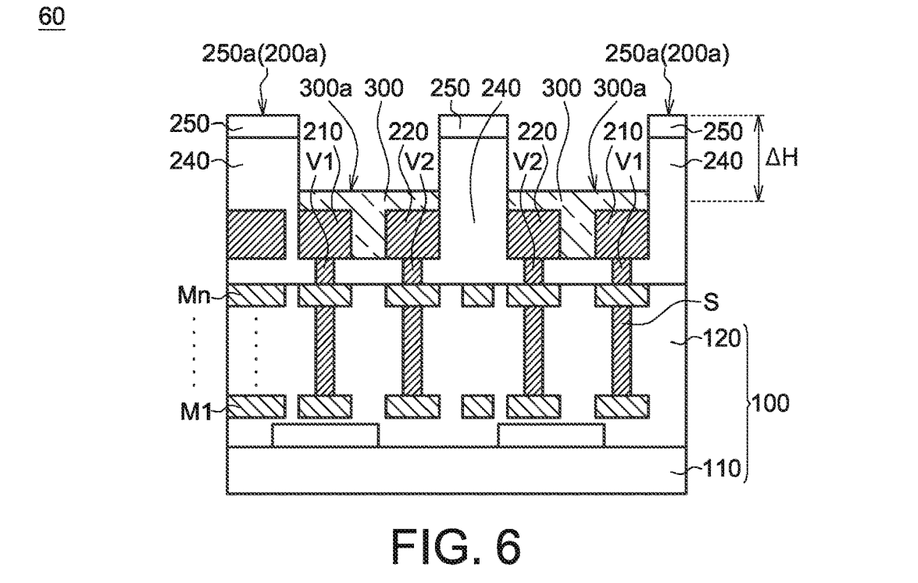
FIG. 6 is a schematic view of an image sensor according to another further embodiment of the present disclosure.

FIG. 6 is a schematic view of an image sensor according to another further embodiment of the present disclosure. The elements in the present embodiment sharing the same or similar labels with those in the previous embodiments are the same or similar elements, and the description of which is omitted. In the present embodiment, the second upmost metal layer is used as the first electrode 210 and the second electrode 220 (pixel electrode). As shown in FIG. 6, in the image sensor 60, the pixel isolation structure 200 may further include a plurality of metal layers 250 located above the first electrode 210 and the second electrode 220. As shown in FIG. 6, the top surface 200a of the pixel isolation structure 200 is the top surfaces 250a of the metal layers 250. Accordingly, the height difference ΔH between the top surface 200a of the pixel isolation structure 200 and the top surface 300a of the opto electrical conversion layer 300 is the height difference between the top surfaces 250a of the metal layers 250 and the top surface 300a of the opto electrical conversion layer 300. The metal layers 250 are electrically isolated from the first electrode 210 and the second electrode 220. In the embodiment as shown in FIG. 6, the top surface 300a of the opto electrical conversion layer 300 is located below the top surfaces of the first electrode 210 and the second electrode 220.

In some embodiments, the metal layers 250 are disposed on the non-conductive layer 240; as such, the first electrode 210, the second electrode 220, the metal layers 250, and the non-conductive layer 240 form the pixel isolation structure 200.

Figure 7:
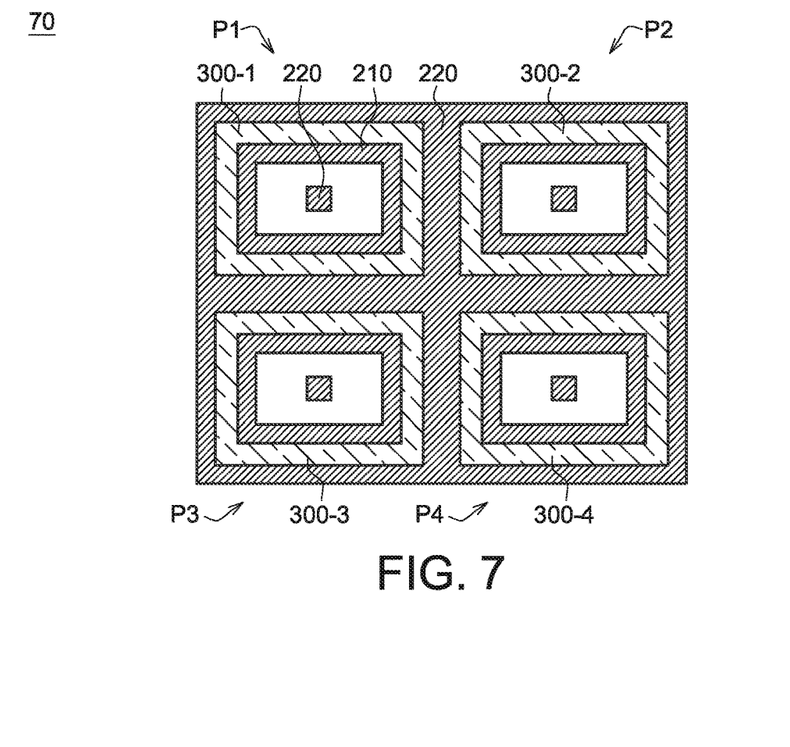
FIG. 7 is a top view of an image sensor according to an additional further embodiment of the present disclosure.

FIG. 7 is a top view of an image sensor according to an additional further embodiment of the present disclosure. The elements in the present embodiment sharing the same or similar labels with those in the previous embodiments are the same or similar elements, and the description of which is omitted. The present embodiment is different from the previous embodiments mainly in the design of arrangements of the first electrode 210 and the second electrode 220.

As shown in FIG. 7, in the image sensor 70, the second electrode 220 defines the pixel regions P1-P4, and the opto electrical conversion portions 300-1, 300-2, 300-3 and 300-4 are disposed respectively corresponding to the pixel regions P1, P2, P3, and P4. The opto electrical conversion portions 300-1, 300-2, 300-3 and 300-4 are separated from one another. Each of the pixel regions is basically rectangular.

Figure 8:
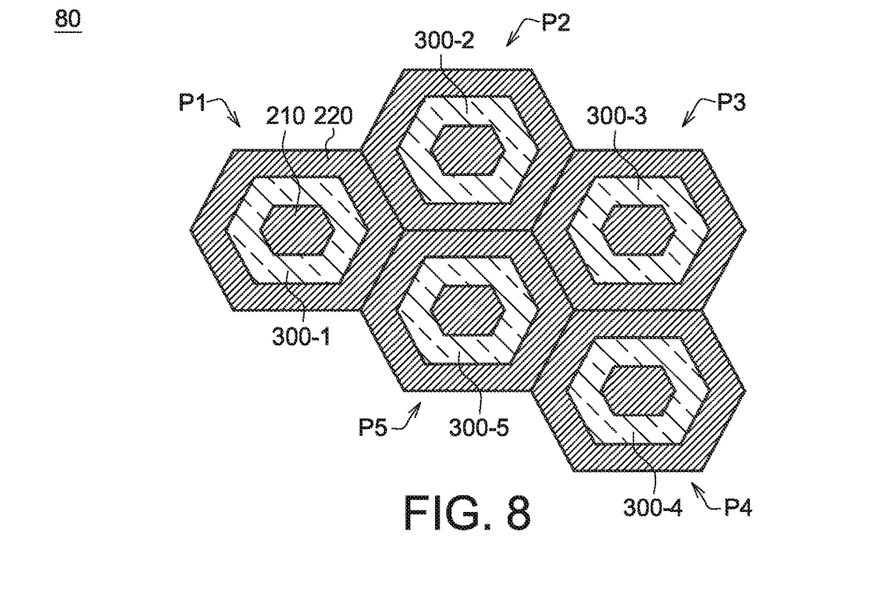
FIG. 8 is a top view of an image sensor according to another additional further embodiment of the present disclosure.

FIG. 8 is a top view of an image sensor according to another additional further embodiment of the present disclosure. The elements in the present embodiment sharing the same or similar labels with those in the previous embodiments are the same or similar elements, and the description of which is omitted. The present embodiment is different from the previous embodiments mainly in the design of arrangements of the first electrode 210 and the second electrode 220.

As shown in FIG. 8, in the image sensor 80, the second electrode 220 defines the pixel regions P1-P5, and the opto electrical conversion portions 300-1, 300-2, 300-3, 300-4 and 300-5 are disposed respectively corresponding to the pixel regions P1, P2, P3, P4, and P5. The opto electrical conversion portions 300-1, 300-2, 300-3, 300-4 and 300-5 are separated from one another. Each of the pixel regions is basically hexagonal.

In some other embodiments, in the structures as shown in FIGS. 7-8, the second electrode 220 may have small openings (not shown in drawings), such that the opto electrical conversion portions of multiple pixel regions P1, P2, P3, and etc. could be connected to one another, and these openings may allow the material of the opto electrical conversion layer to flow between multiple pixel regions; accordingly, the opto electrical conversion layer could be formed with equal heights in multiple pixel regions.

Figure 9:
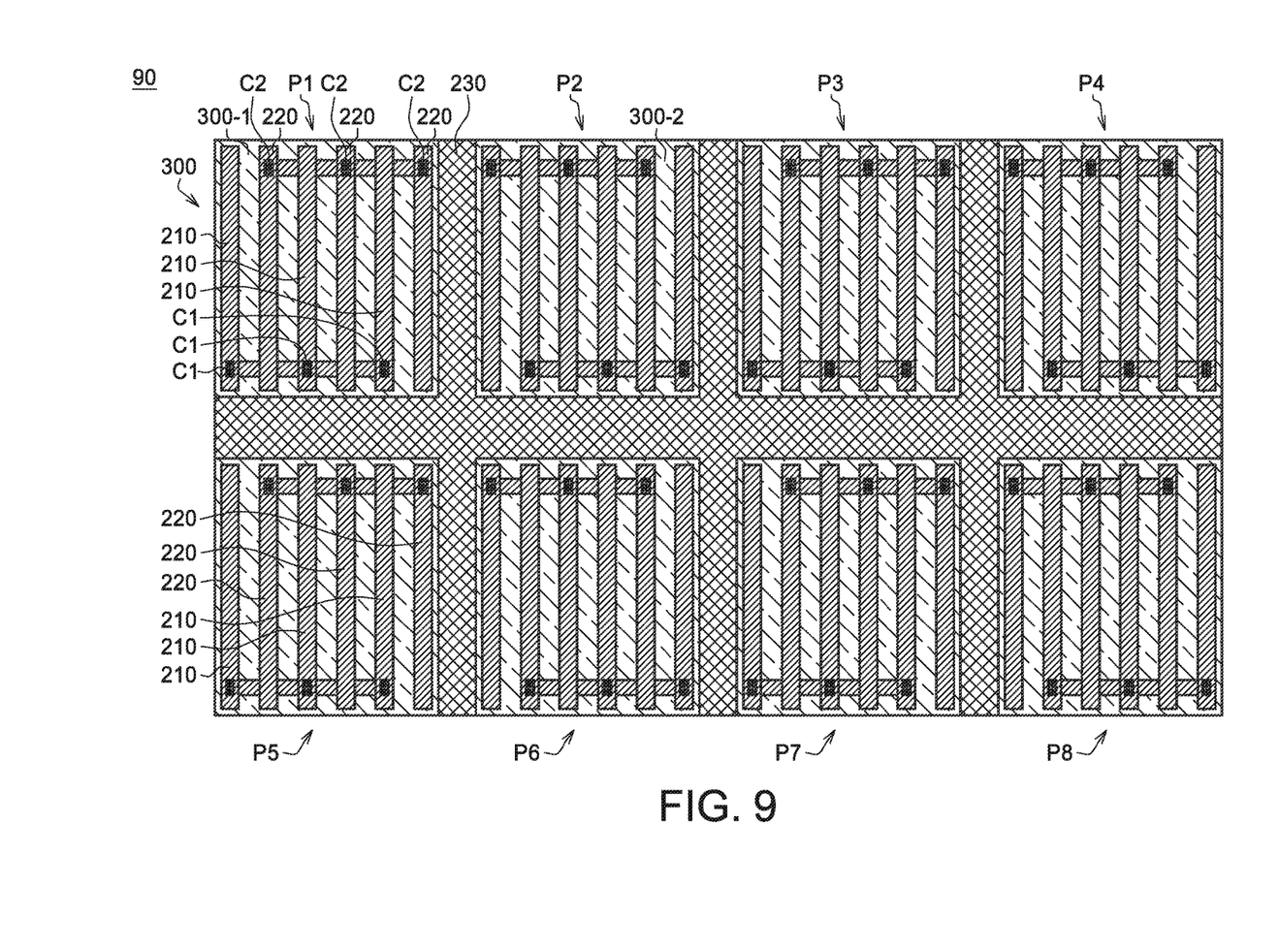
FIG. 9 is a top view of an image sensor according to a still further additional embodiment of the present disclosure.

FIG. 9 is a top view of an image sensor according to a still further additional embodiment of the present disclosure. The elements in the present embodiment sharing the same or similar labels with those in the previous embodiments are the same or similar elements, and the description of which is omitted. The present embodiment is different from the previous embodiments mainly in the design of arrangements of the first electrode 210 and the second electrode 220.

As shown in FIG. 9, the image sensor 90 is a 4×2 pixel region array. The first electrodes 210 and the second electrodes 220 are strip electrodes arranged in parallel. In the present embodiment, the pixel isolation structure 200 formed from the first electrodes 210, the second electrodes 220, and the non-conductive layers 230 defines eight pixel regions P1, P2, P3, P4, P5, P6, P7, and P8. In each of the pixel regions, the first electrodes 210 are electrically connected to the metal layer Mn through the contact holes C1, and the second electrodes 220 are electrically connected to the metal layer Mn through the contact holes C2. The opto electrical conversion layer 300 has eight opto electrical conversion portions corresponding to the eight pixel regions P1-P8.

FIGS. 10A-10D show a manufacturing process of an image sensor (the image sensor 20-1 as shown in FIG. 2-1) according to an embodiment of the present disclosure. Please refer to FIGS. 2-1 and 10A-10D, a manufacturing process of an image sensor according to an embodiment of the present disclosure is described hereinafter. The elements in the present embodiment sharing the same or similar labels with those in the previous embodiments are the same or similar elements, and the description of which is omitted.

Figure 10A:
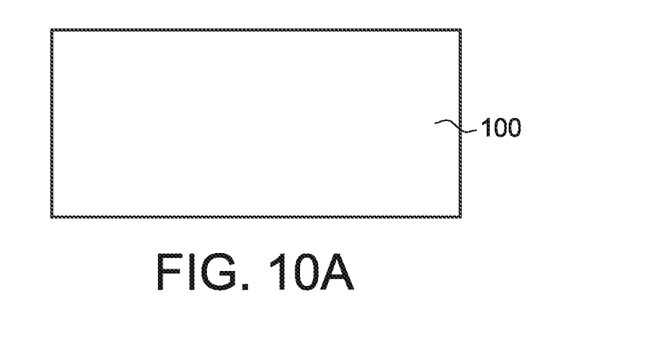
FIGS. 10A-10D show a manufacturing process of an image sensor according to an embodiment of the present disclosure.

As shown in FIG. 10A, in the beginning, a pixel sensing circuit 100 is provided.

Figure 10B:
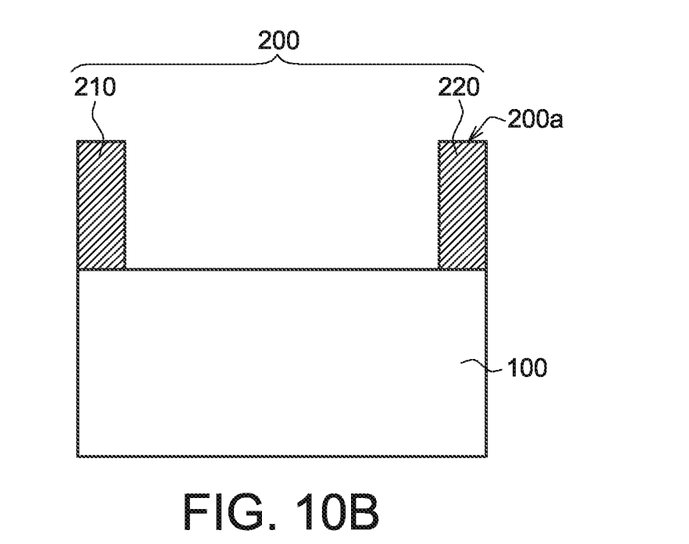

Next, as shown in FIG. 10B, a pixel isolation structure 200 is disposed on the pixel sensing circuit 100. As shown in FIG. 10B, the pixel isolation structure 200 includes a first electrode 210 and a second electrode 220 and is electrically connected to the pixel sensing circuit 100. In the embodiment, the first electrode 210 and the second electrode 220 are manufactured simultaneously on the pixel sensing circuit 100 by a coating process, such that the first electrode 210 and the second electrode 220 could be made by the same coating process, and thus the manufacturing process is simplified.

Figure 10C:
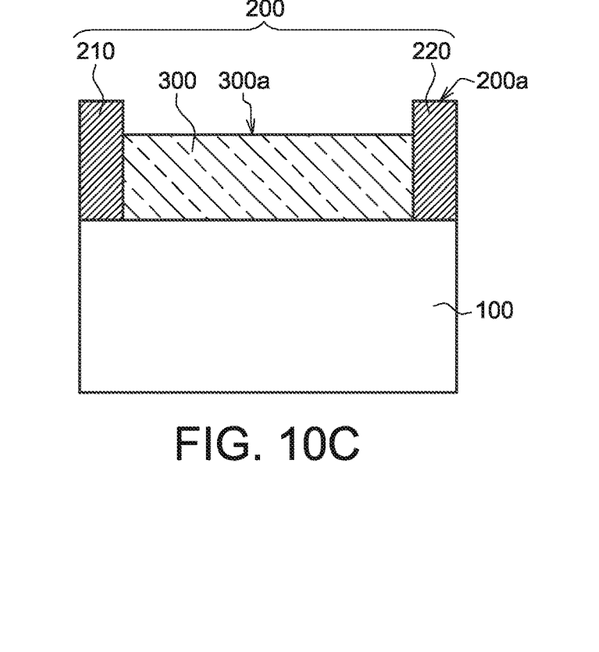

Next, as shown in FIG. 10O, an opto electrical conversion layer 300 is disposed on the pixel sensing circuit 100, and the top surface 300a of the opto electrical conversion layer 300 is below the top surface 200a of the pixel isolation structure 200. In the embodiment, the opto electrical conversion layer 300 is manufactured on the pixel sensing circuit 100 by a coating process. The as-formed opto electrical conversion layer 300 could be naturally isolated within a pixel region by the pixel isolation structure 200 due to the height difference 4H between the top surface 200a and the top surface 300a; accordingly, issues of occurrence of crosstalk caused by the opto electrical conversion layer 300 in adjacent pixel regions could be prevented.

Figure 10D:
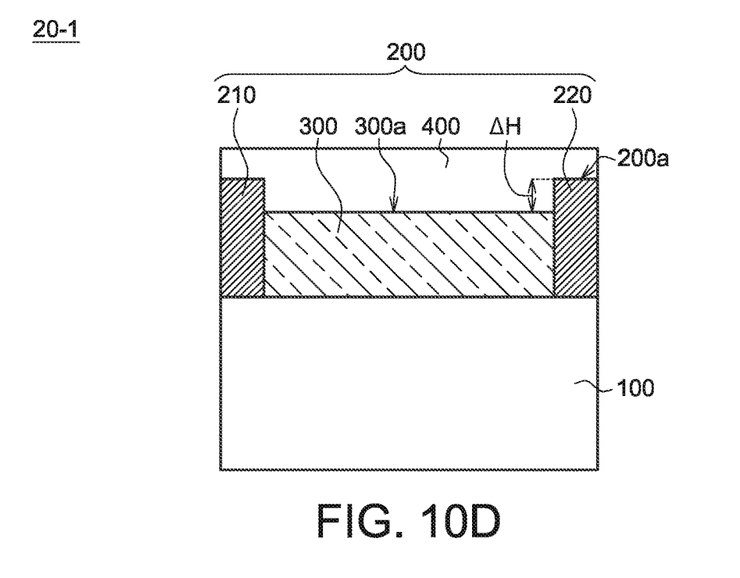

Next, as shown in FIG. 10D, a water-oxygen protection layer 400 is formed. The water-oxygen protection layer 400 covers the pixel sensing circuit 100, the pixel isolation structure 200, and the opto electrical conversion layer 300. As such, the manufacturing of the image sensor 20-1 as shown in FIG. 10D (FIG. 2-1) is completed.

Manufacturing processes of the image sensors 20-2 to 90 as illustrated in FIGS. 2-2 to 9 are respectively described hereinafter according to the manufacturing process of the image sensor 20-1 described in the previous embodiment.

The manufacturing process of the image sensor 20-2 as shown in FIG. 2-2 is different from the previous embodiment mainly in the design of the opto electrical conversion layer 300. In the present embodiment, a carrier transport layer 320 is formed on the pixel isolation structure 200 prior to coating the photo sensing layer 310, and then the photo sensing layer 310 is coated on the carrier transport layer 320, such that the opto electrical conversion layer 300 is formed.

Figure 11A:
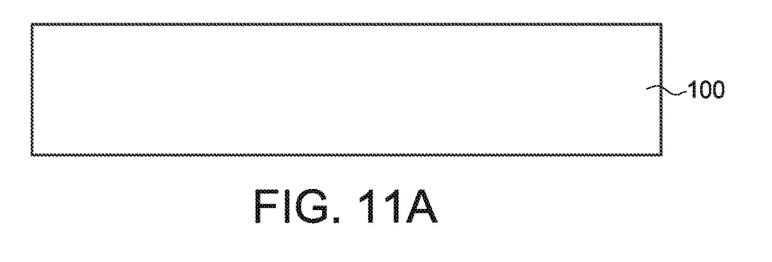
FIGS. 11A-11C show a manufacturing process of an image sensor according to another embodiment of the present disclosure.
Figure 11B:
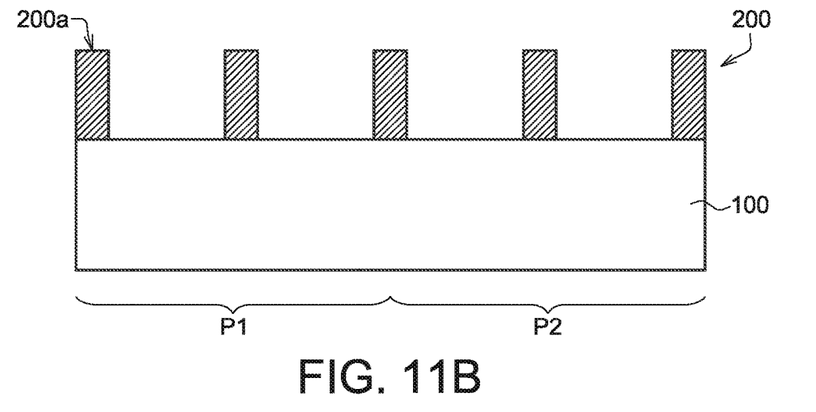
Figure 11C:
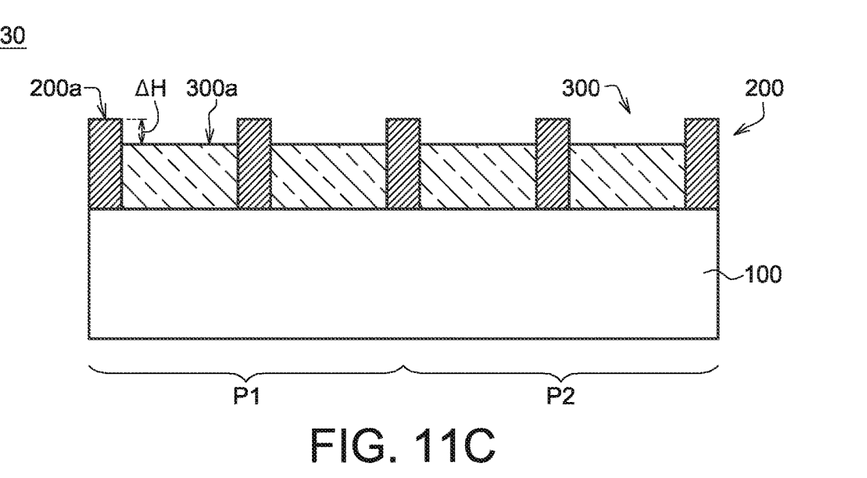

FIGS. 11A-11C show a manufacturing process of an image sensor (the image sensor 30 as shown in FIGS. 3A-3B) according to another embodiment of the present disclosure. The manufacturing process of the image sensor 30 as shown in FIGS. 3A-3B is different from the embodiment previously illustrated in FIG. 2-1 mainly in that the as-formed pixel isolation structure 200 has a different structure. In other words, a pattern which is predetermined according to the pixel isolation structure 200 of the image sensor 30 is applied to perform the patterned coating process of the pixel isolation structure 200.

Specifically speaking, as shown in FIG. 11A, a pixel sensing circuit 100 is provided. Next, as shown in FIG. 11B, a pixel isolation structure 200 is disposed on the pixel sensing circuit 100. The pixel isolation structure 200 defines multiple pixel regions, such as the pixel regions P1 and P2.

Next, as shown in FIG. 11C, an opto electrical conversion layer 300 is coated on the pixel sensing circuit 100 by a coating process. Due to the height difference ΔH between the top surface 200a and the top surface 300a, the as-formed opto electrical conversion layer 300 could be naturally separated by the pixel isolation structure 200 and form multiple opto electrical conversion portions, which are separated from one another, in multiple pixel regions; accordingly, issues of occurrence of crosstalk caused by the opto electrical conversion portions of the opto electrical conversion layer 300 in adjacent pixel regions could be prevented. As such, the manufacturing of the image sensor 30 as shown in FIG. 11A (FIGS. 3A-3B) is completed.

The manufacturing process of the image sensor 40 as shown in FIG. 4 is different from the previous embodiment as shown in FIG. 3 mainly in that the pixel isolation structure 200 has a different structure. In other words, a pattern which is predetermined according to the first electrode 210 and the second electrode 220 of the image sensor 40 is applied to perform the patterned coating process of the pixel isolation structure 200, followed by the formation of non-conductive layers 230 on the first electrode 210 and the second electrode 220.

Specifically speaking, in the present embodiment, the first electrode 210 and the second electrode 220 are formed on the pixel sensing circuit 100 by a single coating process, and then the non-conductive layers 230 are formed on the first electrode 210 and the second electrode 220.

The manufacturing process of the image sensor 50 as shown in FIG. 5 is different from the previous embodiment as shown in FIG. 3 mainly in the as-formed opto electrical conversion layer 300. The coated opto electrical conversion layer 300 of the present embodiment has a higher top surface 300a.

In addition, in the present embodiment, the connection via V1 and V2 may be formed on the pixel sensing circuit 100, and then the first electrode 210 and the second electrode 220 are formed on the connection via V1 and V2.

The manufacturing process of the image sensor 60 as shown in FIG. 6 is different from the previous embodiment as shown in FIG. 5 mainly in that the pixel isolation structure 200 has a different structure. In other words, a pattern which is predetermined according to the first electrode 210 and the second electrode 220 of the image sensor 60 is applied to perform the patterned coating process of the pixel isolation structure 200, followed by the formation of metal layers 250 on the first electrode 210 and the second electrode 220.

Specifically speaking, in the present embodiment, the first electrode 210, the second electrode 220, and the non-conductive layer 240 are formed on the pixel sensing circuit 100 by a single coating process, and then the metal layers 250 are formed on the non-conductive layer 240.

The manufacturing processes of the image sensors 70 and 80 as shown in FIGS. 7-8 are different from the previous embodiments mainly in that the first electrode 210 and the second electrode 220 have different structures. In other words, a pattern predetermined according to the first electrode 210 and the second electrode 220 of the image sensors 70 and 80 is applied to perform the patterned coating process of the pixel isolation structure 200.

The manufacturing process of the image sensor 90 as shown in FIG. 9 is different from the previous embodiments mainly in that the first electrode 210, the second electrode 220, and the non-conductive layers 230 have different structures. In other words, a pattern which is predetermined according to the first electrode 210 and the second electrode 220 of the image sensor 90 is applied to perform the patterned coating process of the pixel isolation structure 200, followed by the formation of non-conductive layers 230 on the first electrode 210 and the second electrode 220.

It will be apparent to those skilled in the art that various modifications and variations can be made to the structure of the disclosed embodiments. It is intended that the specification and examples be considered as exemplary only, with a true scope of the disclosure being indicated by the following claims and their equivalents.

What is claimed is:

1. An image sensor, comprising:
   a pixel sensing circuit;
   a pixel electrode disposed on the pixel sensing circuit, wherein the pixel electrode is electrically connected to the pixel sensing circuit and comprises a first electrode and a second electrode, a top surface of the first electrode and a top surface of the second electrode are coplanar in a horizontal direction, and a bottom surface of the first electrode and a bottom surface of the second electrode are coplanar in the horizontal direction, wherein the first electrode and the second electrode have different polarities;
   a pixel isolation structure disposed on the pixel sensing circuit; and
   an opto electrical conversion layer disposed on the pixel sensing circuit, wherein the opto electrical conversion layer is disposed between the first electrode and the second electrode, a top surface of the opto electrical conversion layer is below a top surface of the pixel isolation structure, and the horizontal direction is parallel to the top surface of the opto electrical conversion layer.

2. The image sensor according to claim 1, wherein a height difference between the top surface of the opto electrical conversion layer and the top surface of the pixel isolation structure is larger than or equal to 0.1 µm.

3. The image sensor according to claim 1, wherein the pixel isolation structure further comprises a plurality of non-conductive layers on the first electrode and the second electrode, and the top surface of the pixel isolation structure is a plurality of top surfaces of the non-conductive layers.

4. The image sensor according to claim 1, wherein the pixel isolation structure further comprises a plurality of metal layers on the first electrode and the second electrode, and the top surface so the pixel isolation structure is a plurality of top surfaces of the metal layers.

5. The image sensor according to claim 1, wherein the pixel isolation structure further comprises a plurality of metal layers and a plurality of non-conductive layers, the metal layers are disposed on the non-conductive layers, and the top surface of the pixel isolation structure is a plurality of top surfaces of the metal layers.

6. The image sensor according to claim 1, wherein the pixel isolation structure defines a plurality of pixel regions, the opto electrical conversion layer has a plurality of opto electrical conversion portions separated from one another, and each of the opto electrical conversion portions is disposed corresponding to each of pixel regions.

7. The image sensor according to claim 1, wherein the opto electrical conversion layer comprises at least one of an organic material and an inorganic-organic composite material.

8. The image sensor according to claim 7, wherein the opto electrical conversion layer comprises a quantum dot material, a methyl ammonium lead iodide perovskite material, or a methyl ammonium lead iodide chloride perovskite material.

9. The image sensor according to claim 1, wherein the opto electrical conversion layer comprises a photo sensing layer and a carrier transport layer, and the carrier transport layer is disposed between the pixel isolation structure and the photo sensing layer.

* * * * *